US010355445B2

(12) United States Patent
Berthoud

(10) Patent No.: US 10,355,445 B2
(45) Date of Patent: Jul. 16, 2019

(54) REDUNDANT OPTICAL RADIANT ENERGY SOURCE AND REDUNDANT OPTICAL DEVICE, ESPECIALLY FOR METROLOGY APPLICATIONS

(71) Applicant: ADVA Optical Networking SE, Meiningen (DE)

(72) Inventor: Patrick Berthoud, Preles (CH)

(73) Assignee: ADVA Optical Networking SE, Meiningen (*) Notice: Subject to any disclaimer, the term of this patent is extended or adjusted under 35 U.S.C. 154(b) by 0 days.

(21) Appl. No.: 15/831,739

(22) Filed: Dec. 5, 2017

(65) Prior Publication Data

US 2018/0159301 A1 Jun. 7, 2018

(30) Foreign Application Priority Data

Dec. 7, 2016 (EP) .................................. 16202780

(51) Int. Cl.
| | |
|---|---|
| *H01S 5/06* | (2006.01) |
| *H01S 5/40* | (2006.01) |
| *H01S 5/022* | (2006.01) |
| *H01S 5/024* | (2006.01) |
| *H01S 5/042* | (2006.01) |
| *H01S 5/068* | (2006.01) |
| *H01S 5/0683* | (2006.01) |

(52) U.S. Cl.
CPC .......... *H01S 5/042* (2013.01); *H01S 5/02296* (2013.01); *H01S 5/02469* (2013.01); *H01S 5/0617* (2013.01); *H01S 5/06825* (2013.01); *H01S 5/4025* (2013.01); *H01S 5/02212* (2013.01); *H01S 5/02415* (2013.01); *H01S 5/0683* (2013.01); *H01S 5/06808* (2013.01)

(58) Field of Classification Search
CPC ............ H01S 5/02296; H01S 5/02469; H01S 5/0617; H01S 5/06808; H01S 5/06; H01S 5/40
USPC ..................................................... 372/29.014
See application file for complete search history.

(56) References Cited

U.S. PATENT DOCUMENTS

| | | | | |
|---|---|---|---|---|
| 5,768,137 A | * | 6/1998 | Polidoro .............. | G05B 19/182 382/152 |
| 6,631,019 B1 | * | 10/2003 | Vujkovic-Cvijin ........................ | H01S 3/1303 398/195 |
| 8,699,533 B1 | * | 4/2014 | Wach ................... | H01S 5/02212 372/34 |
| 2002/0090011 A1 | * | 7/2002 | Pezeshki ............... | H01S 5/4031 372/20 |
| 2002/0126717 A1 | * | 9/2002 | Nasu .................... | G02B 6/4206 372/32 |
| 2003/0039277 A1 | * | 2/2003 | Nasu ................... | H01S 5/02284 372/34 |
| 2015/0116816 A1 | * | 4/2015 | Barannikov ........ | H01S 5/02415 359/337.11 |

* cited by examiner

*Primary Examiner* — Tuan N Nguyen
(74) *Attorney, Agent, or Firm* — The Webb Law Firm

(57) ABSTRACT

A redundant optical radiant energy source, especially for metrology applications, including a redundant optical device for creating optical radiation including at least two semiconductor lasers, which are provided on a thermally conducting laser support, at least one thermal sensor configured to detect the temperature of the laser support or at least one of the semiconductor lasers, respectively; and a heating/cooling device thermally connected to or integrally provided with the laser support.

22 Claims, 2 Drawing Sheets

REDUNDANT OPTICAL RADIANT ENERGY SOURCE AND REDUNDANT OPTICAL DEVICE, ESPECIALLY FOR METROLOGY APPLICATIONS

CROSS-REFERENCE TO RELATED APPLICATION

This application claims priority to European Patent Application No. 16 202 780.9 filed Dec. 7, 2016, the disclosure of which is hereby incorporated in its entirety by reference.

BACKGROUND OF THE INVENTION

Field of the Invention

The invention relates to a redundant optical radiant energy source, especially for metrology applications. Further, the invention relates to a redundant optical device for creating optical radiation, especially for metrology applications.

Description of Related Art

Optical radiant energy sources are widely used in various technical fields. While in the field of data transmission optical radiation is used to transport information, in other technical fields, for example in the field of material treatment and material processing, the optical radiant energy is used to influence the material properties of a workpiece or the shape a workpiece. Further, in the field of metrology, the optical radiant energy can be used to control the internal or external degrees of freedom of particles. This application is of special interest in the field of atomic clocks. Here, the optical radiant energy is supplied to a beam of particles (atoms or molecules) in order to control either the particles' internal degrees of freedom, especially their energy state and spin, or the particles' external degrees of freedom, especially their position and velocity.

In the field of atomic clocks, optical devices for creating optical radiation at an extremely stable center wavelength and having a very narrow optical bandwidth are required. Further, such optical devices must reveal an extremely high stability in respect of the wavelength noise.

In order to guarantee the required stability, temperature-controlled narrowband lasers are used in such optical devices, for example distribution feedback (DFB) lasers or distributed Bragg reflector (DBR) lasers. A laser chip, which is produced using the DFB or DBR technology, is usually assembled into a laser module by mounting it onto a thermally conducting laser support, for example a C-mount support, and placing a thermal sensor close to the laser chip in order to detect its temperature. The laser support or mechanical mount may then be assembled on a thermal electric cooler (TEC) in order to control the temperature of the laser chip to a desired value. Of course, as the center wavelength and other optical properties of the spectrum of the optical radiation created by a semiconductor laser are temperature-dependent, the temperature control may be effected in such a way that the temperature of the laser chip is stabilized at a desired value and thus the optical properties of the radiation created including the center wavelengths are kept constant at respective desired values.

In atomic clocks, redundant laser modules are used so as to achieve a sufficiently high instrument reliability and increase its lifetime. Only one of the laser modules is activated at a given time and automatic switching to the spare laser module in case of failure of the main laser module is implemented.

In order to provide such redundancy at the instrument level, an optical architecture for a redundant optical radiant energy source as shown in FIG. 1 is widely applied. This redundant optical radiant energy source 1 comprises two optical devices 3 and 5 for creating optical radiation in the form of laser modules 7 and 9, respectively. Each of the laser modules 7, 9 comprises a housing 11 comprising a cap 13 and a base part 15. A plurality of electrical connection pins 17 extend through the base part 15. A heating/cooling device 19 is mounted to the surface of the base part 15. Preferably, the heating/cooling device 19 is in good thermal contact with the base part 15, which may consist of a metal, for example copper or aluminum, in order to act as a heat sink if thermal energy must be transported to the outer side of the housing 11. The heating/cooling device 19 may, for example, be a thermo-electric cooler (TEC).

A laser support 21 is mounted to the heating/cooling device 19 in a thermally conducting manner. On or within the laser support 21, a laser chip 23 is provided. Further, on or within the laser port 21 a thermal sensor 25, for example a thermistor, is provided. In the embodiment according to FIG. 1, an embedded laser chip 23 and an embedded thermal sensor 25 are used. Of course, the laser support 21 also consists of a material or material combination having a high thermal conductivity. In this way, the thermal energy produced by the laser chip 23 can be transported to the heat sink realized by the heating/cooling device 19 (as the case may be, in connection with the base part 15). Vice versa, in case the laser chip 23 is to be kept at a desired temperature higher than the temperature which would arise without heating or cooling the chip, the heating/cooling device may produce thermal energy in order to stabilize the temperature of the laser chip 23.

As mentioned above, the laser support 21 may be a C-mount support. The thermal sensor 25 is preferably provided sufficiently close to the laser chip 23 so as to detect the laser chip temperature with sufficient accuracy (and without inacceptable time delay).

As apparent from FIG. 1, the laser chip 23 may be centrally provided within the laser support 21, and the laser support 21 and the heating/cooling device 19 may be centrally provided within the housing 11. The cap 13 of each housing 11 has a window 11a (shown as a dashed line), which is transparent for the optical radiation created by the laser chip 23. In FIG. 1, the optical radiation created by each of the laser chips 23, which are comprised by the laser modules 7, 9, is shown as respective laser beams 27, 29. As mentioned above, the laser chip 23 may be a DFB or DBR laser chip. As the radiation arises from a narrow junction of a few micrometers in the semiconductor material, each of the laser beams is a highly diverging beam. The window 11a may have a size which is sufficient to transmit the whole laser beam created by the laser chip without having the function of an aperture. Of course, the window 11 a may be designed in such a way that the boundaries of the laser beams 27, 29 are defined by the shape of the windows 11a. However, it might be preferred to design the window 11a in such a way that it reveals a size larger than the laser beam cross-section in the plane or area of the window 11a in order to avoid scattering and diffraction induced by the window aperture. The laser beam shape may in this case be defined by a collimation device 35, 37 (see below).

Each of the laser beams 27, 29 has an optical axis 31, 33 which essentially coincides with the axis of the respective laser module 7, 9. The axis of the laser module 7 and the optical axis 31 of the laser beam 27 and the axis of the laser module 9 and the optical axis 33 of the laser beam 29 intersect at a right angle, wherein, in the embodiment shown in FIG. 1, the optical axis 31 is oriented horizontally and the optical axis 33 is oriented vertically.

Each of the laser beams 27, 29 is collimated by a collimation device 35, 37, wherein the optical axis of the collimation device is adjusted so that it coincides with the optical axis of the respective laser beam 27, 29. The collimation devices 35, 37 may be adjustable in a plane perpendicular to the respective beam axis 27, 29 and, if required, also in direction of the optical axis. The lateral adjustment accuracy influences the beam's homogeneity and the beam's tilt angles, while its axial adjustment accuracy determines the beam's parallelism.

As shown in FIG. 1, the diverging laser beams 27, 29 as created by the laser chips 23 of the laser modules 7, 9 are converted into essentially parallel laser beams due to the function of the collimation devices 35, 37.

The collimated laser beams 27, 29 are directed to a beam splitter 39, for example a semitransparent mirror. The beam splitter 39 may be a non-polarizing beam splitter, wherein, in this case, a common spitting ratio is 50:50, that is 50% of the available optical power of each of the laser beams 27, 29 is dropped. Of course, as mentioned above, only a selected one of the laser beams 27, 29 is present at the time as one of the laser modules 7, 9 serves as a main source and the other one serves as a redundant source. By using a polarized beam splitter, the power loss may be reduced to zero (apart from material absorption). However, both beams will be orthogonally polarized, which might not be acceptable for specific applications.

The optical arrangement shown in FIG. 1 has the advantage that it is fully configurable as there are independent laser modules, collimation devices and optical alignment means. However, this arrangement suffers from increased complexity, reduced reliability due to multiple required alignments and a significant power drop. This leads to high costs for realizing such an optical arrangement.

SUMMARY OF THE INVENTION

It is thus an object of the present invention to provide a redundant optical radiant energy source, especially for metrology applications, which requires less parts, reveals an increased efficiency and is easier to adjust. It is a further object of the invention to provide a redundant optical device for realizing a redundant optical radiant energy source, especially for metrology applications.

The invention achieves these objects by providing a redundant optical radiant energy source, especially for metrology applications, as well as a redundant optical device.

According to the invention, it is proposed to use a redundant optical device for providing a redundant optical radiant energy source, especially for metrology applications, wherein the redundant optical device comprises at least two semiconductor lasers, which are provided on a thermally conducting laser support, at least one thermal sensor configured to detect the temperature of the laser support or at least one of the semiconductor lasers, respectively, and a heating/cooling device thermally connected to or integrally provided with the laser support. The at least two semiconductor lasers are provided on the same laser support, which is thermally connected to the heating/cooling device. Further, the at least two semiconductor lasers, the laser support and the heating/cooling device are designed in such a way that only a selected one of the at least two semiconductor lasers may be activated at a time. The redundant optical radiant energy source additionally comprises a control device, which is connected to each of the at least one semiconductor lasers, the heating/cooling device and the at least one thermal sensor, wherein the control device is configured to control the at least two semiconductor lasers in such a way that only a selected one of the at least two semiconductor lasers is active at a time.

In this way, the required redundancy of laser sources is directly realized at the laser module level instead of at the optical instrument level. This makes it possible to position the laser chips, which create the optical radiation, side by side on a mechanical laser substrate. This reduces the number of components as only a single TEC, thermal sensor and mechanical support is required. Further, only a single collimation device and a single adjusting device for two-dimensionally or three-dimensionally adjusting the collimation device are required. This significantly reduces the number of opto-mechanical mounts at the optical system level, which also reduces the costs for assembling and adjusting the redundant optical radiant energy source. Additionally, no beam splitter is required, which further reduces the parts' and labor cost while simultaneously the 50% power loss is avoided.

According to an embodiment of the invention, the control device is configured to activate another one of the at least two semiconductor lasers in case of failure of the currently active semiconductor laser, wherein the control device uses a dedicated control information for controlling each of the at least two semiconductor devices. For this purpose, the control device may be connected to at least one sensor for measuring the output power of the active semiconductor laser, e.g. to a monitor diode comprised by each of the semiconductor lasers or to a separate sensor. In case the sensor signal comprises the information that the optical power cannot be controlled to be stabilized at a desired given value or that the optical power is zero, the control device may activate the other or another selected semiconductor laser and deactivate the apparently defect one.

According to a further embodiment, the control device may comprise memory means for storing the dedicated control information or may be configured to receive the control information at a control information input port from an external device. The control information dedicated to each of the semiconductor devices may comprise one or more dependencies of spectral parameters depending on values for the laser drive current and/or one or more laser control voltages or currents and/or the temperature detected by the thermal sensor (e.g. the analytical or discrete dependency of the center wavelength and/or the optical power depending on the drive current and/or a tuning voltage or current).

The optical radiant energy source may further comprise a focusing optical device, especially an optical collimation device, having an optical axis, wherein the optical axis of the optical collimation device is adjusted in such a way that it intersects an imaginary emission point or area located in a center of the straight line (in case of only two semiconductor lasers) or plane (in case of three or more semiconductor lasers) in which the points or areas of emission of the at least two semiconductor lasers are located, wherein the optical axis is perpendicular to the straight line or plane. In this way, a simple and single optical device (having a single optical axis) may be used to form the radiation, i.e. the beam created by the active semiconductor laser in a desired manner and directed to a desired point or area, e.g. to a volume of a particle beam. Of course, as the emission points or areas of the semiconductor lasers are separated, the position of the optical device cannot be adjusted optimally for both semiconductor lasers. By tuning the lens to the imaginary emission point or area, the collimated beams will not coincide but will differ to a certain extent, which leads, depending on the distance of the area or volume which the radiation is to be guided or focused to, to a certain beam aberration.

This may, however, be acceptable in many applications if the aberration is within an acceptable range. For example, in the field of controlling the status of particles in a beam of particles, a laser aberration in the region of tenths of millimeters may be acceptable. This may be achieved even if the distance between the radiation emitting point or area and the area which the radiation is guided to is in the region of some centimeters to tens of centimeters.

In a further embodiment of the invention, the control device comprises a laser driver unit having an output port for outputting the laser drive current, wherein the output port is connected to an input port of controllable electrical switch means, which is connected, at dedicated output ports, to the at least two semiconductor lasers and wherein the control device controls the electrical switch means so as to connect the input port to a selected output port. In this way, only a single laser driver unit is required.

Further, according to the invention, only a single temperature control means comprising at least one temperature sensor (preferably a single temperature sensor), a single heating/cooling device and a thermostat means (separate from or realized by a microprocessor unit) is required in order to control the temperature of both semiconductor lasers. As only one laser is operated at a time, the temperature can be tuned to the operational temperature of the respective active semiconductor laser in order to create an optical radiation having the same wavelength. Of course, as the semiconductor laser wavelengths depend on both the laser temperature and the laser current, both parameters must be controlled to the appropriate values. As usually two different semiconductor laser chips have different tuning points, the control device may comprise two sets of tuning parameters, preferably stored in a memory. The mass of the laser support and thus the thermal inertia can be kept so small that the temperature adjustment is sufficiently fast (some seconds only) when it is switched from one semiconductor laser to the other.

According to a further embodiment, the redundant optical device is comprised within a housing, preferably a sealed housing, wherein the housing has a transparent window for transmitting the optical radiation created by either of the at least two semiconductor lasers. For example, a standard TO3 package may be used, which has eight pins, thus allowing each of the two semiconductor lasers (each having two connection electrodes), a thermal sensor (having two connection electrodes) and the heating/cooling device in the form of a TEC (also having two connection electrodes) to be connected separately. Of course, the whole control unit or parts thereof, especially the switching means, may be comprised within the housing.

According to an embodiment of the invention, the at least two semiconductor lasers of the redundant optical device may be provided closely neighbored in such a way that— apart from acceptable deviations—the radiation emitted by the semiconductor lasers covers, at least in the far field region, essentially the same solid angle. The closer the at least two semiconductor lasers (i.e. the emitting areas thereof) are positioned the lower the beam aberration is in the area or volume to be irradiated. It is, of course, advantageous to use identical designs for the semiconductor lasers in order to achieve as similar conditions as possible in the area or volume to be irradiated even if it is switched from one semiconductor laser to another one.

According to a further embodiment, a single thermal sensor is provided on or within the laser support, preferably close to the at least one semiconductor lasers. In order to obtain as similar conditions as possible for measurement of the temperature of each of the semiconductor lasers, the thermal sensor may be positioned in such a way that the distance to each of the semiconductor lasers is essentially identical. If sufficiently similar conditions for measuring the temperature of each of the semiconductor lasers cannot be achieved, a dedicated analytical or discrete dependency may be used for calculating the actual temperature based on a measured temperature or a parameter representing the temperature.

In order to achieve a minimum distance between the at least two emitting areas of the at least two semiconductor lasers, each of the at least two semiconductor lasers may be provided on a separate substrate, which is, with respect to the structure forming the semiconductor laser, restricted to a minimum in its dimension perpendicular to the axis of the radiation emitted by the respective laser. Instead of using separate chips forming a respective semiconductor laser, it is of course also possible to provide the two semiconductor lasers on the same substrate, i.e. to use a single chip comprising two semiconductor laser structures.

BRIEF DESCRIPTION OF THE DRAWINGS

Further objects and advantages of the present invention will become apparent from the following description of a preferred embodiment that is given by way of example with reference to the accompanying drawings, wherein.

DESCRIPTION OF THE INVENTION

Figure 1:
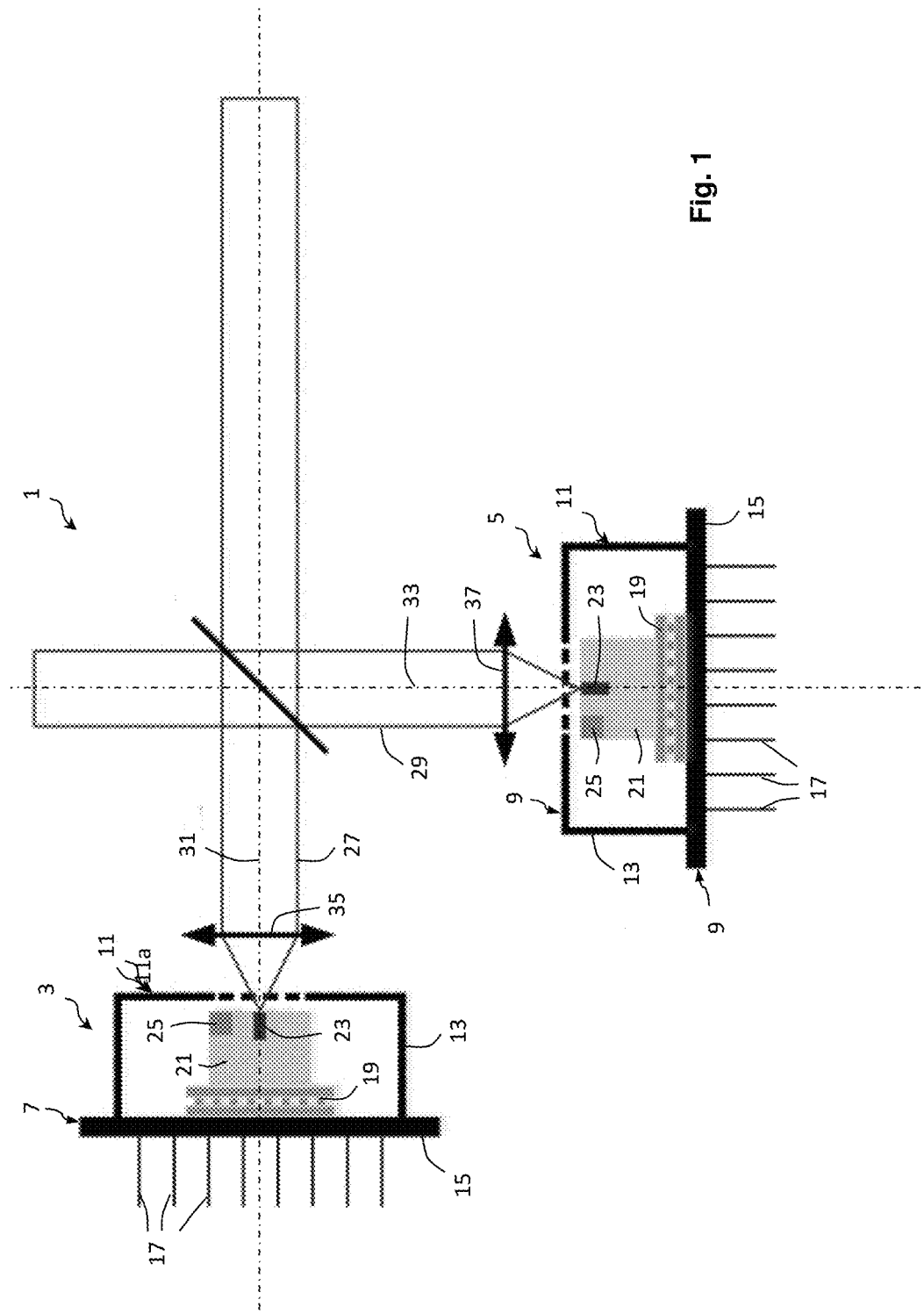
FIG. 1 shows a schematic block diagram of a prior art redundant optical radiant energy source comprising two different optical paths of two widely spaced semiconductor laser modules which are combined to a single optical path using a beam splitter.
Figure 2:
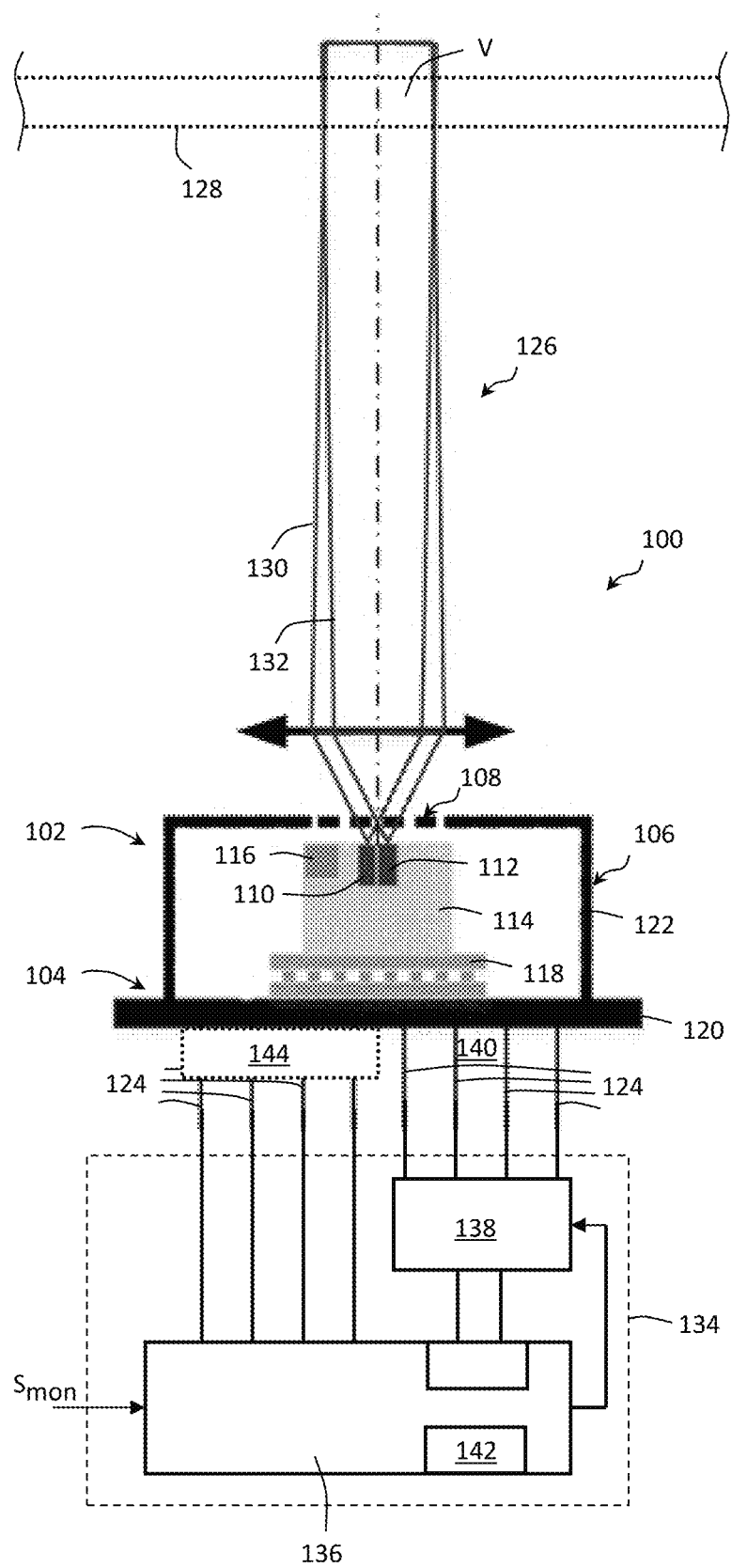
FIG. 2 shows an embodiment of a redundant optical radiant energy source according to the invention using a single semiconductor laser module comprising two semiconductor lasers.

FIG. 2 schematically shows a redundant optical radiant energy source 100 comprising a single redundant optical device 102, which is realized by a single laser module 104. The laser module 104 comprises a housing 106, which is preferably realized as a sealed housing, for example a standard TO3 package (which is available with eight connection pins). The housing 106 has a window 108, which is transparent for the radiation created by two semiconductor lasers 110, 112. The semiconductor lasers 110, 112 may be realized as two separate laser chips each comprising a substrate on which the semiconductor laser structure is provided. It is, of course also possible to provide the two semiconductor laser structures on a single substrate.

If two separate laser chips are used, the respective substrates shall have a dimension as small as possible in the direction perpendicular to the axis of the radiation created in order to make it possible to arrange the two laser chips, i.e. the emitting areas of the laser structures as close together as possible. Also, if the two laser structures are provided on the same substrate, the emitting areas shall be provided as close together as possible.

The two semiconductor lasers 110, 112 are provided on a mechanical laser support 114, for example a C-mount. A thermal sensor 116, for example an NTC, is provided in close vicinity to the semiconductor lasers 110, 112. As explained above, it is advantageous to place the thermal sensor 116 at essentially the same distance to the semiconductor lasers 110, 112 in order to provide conditions as similar as possible for measuring the temperature of the laser chips or laser structures, respectively.

The laser support 114 is arranged on the surface of a heating/cooling device 118, for example a thermal-electric cooler (TEC). The laser support 114 is made of a thermally well conducting material, for example copper. The thermal resistance between the laser support 114 and the heating/cooling device 118 shall be kept as low as possible. The whole arrangement comprising the heating/cooling device 118, the laser support 114, the semiconductor lasers 110, 112 and the thermal sensor 116 is fixed to a base plate 120 of the housing 106. A cap 122 of the housing 106 is mechanically fixed to the base plate 120, preferably in a sealed manner.

Of course, the semiconductor lasers are provided within the inner space of the housing 106 in such a way that the radiation or laser beams created by the two semiconductor lasers 110, 112 are fully transmitted through the window 108.

The housing 106 comprises a sufficient number (in the embodiment shown in FIG. 2, eight) connection pins 124 which extend electrically isolated through the base plate 120. As in case of the embodiment shown in FIG. 2, a pair of connection pins may be used to electrically connect the heating/cooling device 118, the thermal sensor 116 and each of the semiconductor lasers 110, 112.

As schematically shown in FIG. 2, a single focusing optical device 126, for example a collimating device, may be used to focus the highly diverging beam created by each of the two semiconductor lasers 110, 112. It shall be mentioned that the term "focusing optical device" shall comprise all types of devices that transform the shape of the beams created by the laser structures. For example, the focusing optical device 126 may consist of a single collimation lens. The focusing optical device 126 has an optical axis A. The focusing optical device 126 may be configured in such a way that the optical axis A can be shifted in a plane perpendicular to the axes of the laser beams created by the semiconductor lasers 110, 112. Usually, the semiconductor lasers 110, 112 are provided on or within the laser support 114 in such a way that the two optical axes of the laser beams created by the lasers are essentially parallel. The focusing optical device 126 may further be configured to be adjustable in the direction of the optical axis A. Especially, the focal plane may be adjustable by moving at least one lens comprised by the optical device 126 in the direction of the optical axis A. If a collimating lens is used as a focusing optical device 126, the focus shall be positioned in the center of the distance between the centers of the emitting areas of the semiconductor lasers 110, 112.

The optical axis A of the focusing optical device 126 is adjusted so that the axis A intersects the center of the straight line connecting the centers of the emitting areas of the laser structures (which are usually provided in the same plane) at a right angle. Of course, as apparent from the schematic drawing of FIG. 2, the (focused or collimated) laser beams downstream the focusing optical device 126 are not fully congruent, but reveal a certain beam aberration due to and dependent on the distance of the centers of the emitting areas of the semiconductor lasers 110, 112.

However, the beam aberration can be kept within an acceptable magnitude for many applications, for example for influencing the energy state of particles of a particle beam as used in atomic clocks. As shown in FIG. 2, a particle beam 128 may be irradiated by each of the beams 130, 132 created by the semiconductor lasers 110, 112. The laser beams 130, 132 irradiate an almost identical volume V of the particle beam 128 due to the rather small beam aberration. Thus, the effect of the beams on this volume V of each of the beams 130, 132 (only one of which is created at a time) is the same within acceptable tolerances.

The redundant optical radiant energy source 100 further comprises a control device 134, which is configured to appropriately control the redundant optical device 102. The controller device 102 may comprise a microprocessor unit 136 including a soft- or firmware configured to carry out all the necessary control tasks and a switching unit 138, which is configured to connect a selected one of the semiconductor lasers 110, 112 to a laser driver unit comprised by the controller device 102 or the microprocessor unit 136, respectively.

A selected one of the semiconductor lasers 110, 112 may be used as a main semiconductor laser whereas the other one may be used as a redundant or spare semiconductor laser. In a normal operating mode, the microprocessor unit 136 controls the switching unit or switching means 138 so that the main semiconductor laser, for example the semiconductor laser 110, is activated. Thus, a respective laser beam 130 is created. In case the main semiconductor laser fails (for example if no radiation is created at all or if the optical power of the radiation is below a threshold value or the laser wavelength is too far off the desired value, e.g. the optical resonance frequency of the probed particles of a particle beam), the microprocessor unit 136 activates the redundant semiconductor laser, for example the semiconductor laser 112. As explained above, the laser beam 132 created by the redundant semiconductor laser 112 essentially has the same effect on the particle beam 128 as the main laser beam 130.

A failure of the main semiconductor laser 110 may be detected by using an external monitoring diode (not shown), which creates a monitoring signal $S_{mon}$ that is supplied to the control device 134 or the microprocessor unit 136, respectively. As an alternative, a failure of the semiconductor lasers 110, 112 may be detected by using a monitoring diode (not shown), which is integrated into the semiconductor lasers 110, 112. Of course, in this case, additional electrical connection pins of the housing 106 may be required. A failure due to an unacceptable deviation from a desired wavelength may be detected by using a wavelength sensitive device. If the optical radiant energy source is used to excite a particle beam, a selected property of the particle beam may be used in order to detect whether the wavelength of the optical radiant energy source matches the desired wavelength with sufficient accuracy.

As apparent from FIG. 2, the switching unit 138 comprises two input ports, which are connected to the microprocessor unit 136 and which serve to supply the drive current to the respective semiconductor laser 110, 112. The switching unit 138 is configured to connect the input ports to a selected pair of output ports, wherein each pair of the output ports is connected to the respective connection electrodes of a dedicated semiconductor laser 110, 112. In this way, the semiconductor lasers 110, 112 are electrically connected to the microprocessor unit 136 completely independently of each other. It would of course also be possible to use one electrode of each of the semiconductor lasers 110, 112 as a common electrode and to switch the respective other electrodes, which are connected to respective output ports of the switching unit, selectively to an input port of the switching unit.

As shown in FIG. 2, the microprocessor unit 136 may comprise a laser driver unit 140, which is configured to controllably supply the laser drive current having a predetermined value to the switching unit 138 and the respective semiconductor laser 110, 112. The laser driver unit 140 may comprise an appropriate feedback control in order to stabilize the laser drive current.

The controller device 134 or the microprocessor unit 136, respectively, may further comprise a memory 142 for storing control information for each of the semiconductor lasers 110, 112. For example, the information may comprise analytical or discrete dependencies of the center wavelength on the laser current and/or the temperature of the respective laser structure.

It is of course also possible to use more complex structures of the semiconductor lasers comprising one or more additional( )control electrodes, for example a separate control electrode for receiving a control signal for tuning the center wavelength separately (even if not independently) from the laser drive current. In this way, the laser power may be kept constant while the center wavelength can be varied. Of course, further control signals must be supplied to the respective semiconductor lasers from the controller device 134 or the microprocessor unit 136, respectively. Information concerning the respective characteristic of such more complex laser structures may also be stored in the memory 142.

The microprocessor unit 136 is further configured to stabilize the temperature of the semiconductor lasers 110, 112 at a predetermined value. As mentioned above, a dedicated pair of electrical connection pins 124, which connects the microprocessor unit 136 or the control device 134, respectively, to the heating/cooling device 118, serves this purpose.

A feedback-loop control can be established for the temperature control by using the sensor signal of the thermal sensor 116, which is supplied to the microprocessor unit 136 by the respective pair of electrical connection pins 124.

The control device 134 or the microprocessor unit 136, respectively, uses the respective dedicated set of information if the respective semiconductor laser 110, 112 is activated.

Of course, the control device 134 may also comprise a thermostat device separate from and controlled by the microprocessor 136 or, as indicated in dotted lines in FIG. 2, a thermostat device 144 comprised by the microprocessor unit 136 in order to establish the temperature control.

According to the invention, a redundant optical device comprising at least two semiconductor lasers in a single laser module can be used for specific applications, especially for realizing a redundant optical radiant energy source for controlling the state of particles of a particle beam. As the semiconductor lasers are provided on the same mechanical support, it is possible to use a single temperature control means comprising at least one temperature sensor (preferably a single temperature sensor), a single heating/cooling device and a thermostat means (separate from or realized by a microprocessor unit) in order to control the temperature of both lasers. If the control device—in case of failure of the active semiconductor laser—switches to the respective other semiconductor laser, it controls the laser current and the temperature in such a way that the wavelength of the respective other laser is kept at the desired value. For this purpose, the control device may use a separate set of parameters for appropriately controlling the temperature and the laser current. As the at least two semiconductor lasers are arranged close to each other, a single focusing optical device may be used to direct the beam of each of the semiconductor lasers to a targeted area or volume with an accuracy that is sufficient for many applications. Of course, the accuracy increases if the at least two semiconductor lasers are arranged as close to each other as possible. No beam splitter is required in order to combine the respective laser beams to a common optical path. Thus, a power loss as is caused by semi-transparent mirrors is avoided.

LIST OF REFERENCE SIGNS 1 redundant optical radiant energy source
3 optical device
5 optical device
7 laser module
9 laser module
11 housing
11a window
13 cap
15 base part
17 electrical connection pin
19 heating/cooling device
21 laser support
23 laser chip
25 thermal sensor
27 laser beam
29 laser beam
31 optical axis
33 optical axis
35 collimation device
37 collimation device
39 beam splitter
100 redundant optical radiant energy source
102 redundant optical device
104 laser module
106 housing
108 window
110 semiconductor laser
112 semiconductor laser
114 laser support
116 thermal sensor
118 heating/cooling device
120 base plate
122 cap
124 connection pins
126 optical focusing device
128 particle beam
130 laser beam
132 laser beam
134 control device
136 microprocessor unit
138 switching unit
140 laser driver unit
142 memory
144 thermostat
A optical axis

The invention claimed is:

1. An optical radiant energy source for metrology applications comprising:
  (a) a redundant optical device for creating optical radiation
    (i) comprising
      (1) at least two semiconductor lasers, which are provided on a thermally conducting laser support, (2) at least one thermal sensor configured to detect a temperature of the thermally conducting laser support or at least one of the semiconductor lasers, respectively; and (3) a heating/cooling device thermally connected to or integrally provided with the thermally conducting laser support;

(ii) wherein the at least two semiconductor lasers are provided on the same thermally conducting laser support, which is thermally connected to the heating/cooling device, (iii) wherein the at least two semiconductor lasers, the thermally conducting laser support and the heating/cooling device are designed in such a way that a selected one of the at least two semiconductor lasers may be activated at a time, and (iv) wherein the at least two semiconductor lasers are provided closely neighbored in such a way that the radiation emitted by the semiconductor lasers covers, at least in the far field region, essentially the same solid angle, and (b) a control device, which is connected to each of the at least one semiconductor lasers, the heating/cooling device and the at least one thermal sensor, wherein the control device is configured to control the at least two semiconductor lasers in such a way that only a selected one of the at least two semiconductor lasers is active at a time.

2. The optical radiant energy source according to claim 1, wherein the optical radiant energy source further comprises an optical focusing device having an optical axis, wherein the optical axis of the optical focusing device is adjusted in such a way that it intersects an imaginary emission point or area located in a center of the straight line or plane in which the points or areas of emission of the at least two semiconductor lasers are located.

3. The optical radiant energy source according to claim 2, wherein the optical focusing device is an optical collimation device.

4. The optical radiant energy source according to claim 1, wherein the control device comprises a laser driver unit having an output port for outputting a laser drive current, wherein the output port is connected to an input port of the controllable electrical switch, which is connected, at dedicated output ports, to the at least two semiconductor lasers and wherein the control device controls the electrical switch so as to connect the input port to a selected output port.

5. The optical radiant energy source according to claim 4, wherein the electrical switch is comprised within the housing.

6. The optical radiant energy source according to claim 1, wherein the redundant optical device is comprised within a housing wherein the housing has a transparent window for transmitting the optical radiation created by either of the at least two semiconductor lasers.

7. The optical radiant energy source according to claim 6, wherein the housing is a sealed housing.

8. The optical radiant energy source according to claim 1, wherein the control device uses a dedicated control information for controlling each of the at least two semiconductor lasers.

9. The optical radiant energy source according to claim 8, wherein the control device is configured to activate another one of the at least two semiconductor lasers in case of failure of the currently active semiconductor laser.

10. The optical radiant energy source according to claim 9, wherein the control device comprises a memory for storing the dedicated control information or is configured to receive the control information at a control information input port from an external device.

11. The optical radiant energy source according to claim 9, wherein the dedicated control information comprises one or more dependencies of spectral parameters depending on values for an analytical or discrete dependency of a center wavelength and/or optical power depending on drive current and/or a tuning voltage or current laser drive current and/or one or more laser control voltages or currents and/or the temperature detected by the thermal sensor.

12. A redundant optical device for creating optical radiation for metrology applications comprising:

(a) at least two semiconductor lasers, which are provided on a thermally conducting laser support, (b) at least one thermal sensor configured to detect the temperature of the thermally conducting laser support or at least one of the semiconductor lasers, respectively; and (c) a heating/cooling device thermally connected to or integrally provided with the thermally conducting laser support;

wherein:

(d) the at least two semiconductor lasers are provided on the same thermally conducting laser support, which is thermally connected to a single heating/cooling device, (e) the at least two semiconductor lasers, the thermally conducting laser support and the heating/cooling device are designed in such a way that only a selected one of the at least two semiconductor lasers may be activated at a time, and (f) the at least two semiconductor lasers are provided closely neighbored in such a way that the radiation emitted by the semiconductor lasers covers, at least in the far field region, essentially the same solid angle.

13. The redundant optical device according to claim 12, wherein the at least two semiconductor lasers, the at least one thermal sensor, the laser support and the heating/cooling device are arranged in a housing.

14. The redundant optical device according to claim 12, wherein a single thermal sensor is provided on or within the thermally conducting laser support.

15. The redundant optical device according to claim 12, wherein each of the at least two semiconductor lasers comprises a substrate, which is, with respect to the structure forming the semiconductor laser, restricted to a minimum in its dimension perpendicular to the axis of the radiation emitted by the respective semiconductor laser.

16. The redundant optical device according to claim 12, wherein each of the at least two semiconductor lasers are provided on a single substrate.

17. The redundant optical device according to claim 12, wherein the housing is a sealed housing.

18. The redundant optical device according to claim 12, wherein another one of the at least two semiconductor lasers is configured to be activated in case of failure of the currently active semiconductor laser.

19. An optical radiant energy source for metrology applications comprising:

(a) a redundant optical device for creating optical radiation (i) comprising (1) at least two semiconductor lasers, which are provided on a thermally conducting laser support, (2) at least one thermal sensor configured to detect a temperature of the thermally conducting laser support or at least one of the semiconductor lasers, respectively; and (3) a heating/cooling device thermally connected to or integrally provided with the thermally conducting laser support;

(ii) wherein the at least two semiconductor lasers are provided on the same thermally conducting laser support, which is thermally connected to the heating/cooling device, (iii) wherein the at least two semiconductor lasers, the thermally conducting laser support and the heating/cooling device are designed in such a way that a selected one of the at least two semiconductor lasers may be activated at a time, (b) a control device, which is connected to each of the at least one semiconductor lasers, the heating/cooling device and the at least one thermal sensor, wherein the control device is configured to control the at least two semiconductor lasers in such a way that only a selected one of the at least two semiconductor lasers is active at a time, and (c) an optical focusing device having an optical axis, wherein the optical axis of the optical focusing device is adjusted in such a way that it intersects an imaginary emission point or area located in a center of the straight line or plane in which the points or areas of emission of the at least two semiconductor lasers are located.

20. The redundant optical device according to claim 19, wherein another one of the at least two semiconductor lasers is configured to be activated in case of failure of the currently active semiconductor laser.

21. The redundant optical device according to claim 19, wherein the at least two semiconductor lasers are provided closely neighbored in such a way that the radiation emitted by the semiconductor lasers covers, at least in the far field region, essentially the same solid angles.

22. The redundant optical device according to claim 21, wherein each of the at least two semiconductor lasers is controlled based on dedicated control information comprising one or more dependencies of spectral parameters depending on values for analytical or discrete dependency of a center wavelength and/or optical power depending on drive current and/or a tuning voltage or current and/or the temperature detected by the at least one thermal sensor.

* * * * *